United States Patent [19]

Phillips

[11] Patent Number: 5,124,569
[45] Date of Patent: Jun. 23, 1992

[54] DIGITAL PHASE-LOCK LOOP SYSTEM WITH ANALOG VOLTAGE CONTROLLED OSCILLATOR

[75] Inventor: Lewis A. Phillips, Rockville, Md.

[73] Assignee: Star Technologies, Inc., Sterling, Va.

[21] Appl. No.: 599,460

[22] Filed: Oct. 18, 1990

[51] Int. Cl.$^5$ .......................... H03K 5/00; H03K 5/13
[52] U.S. Cl. ...................... 307/262; 307/480;
307/269; 307/219; 307/602; 328/63; 328/72;
328/155; 331/2; 331/11; 331/47; 331/55
[58] Field of Search ...................... 331/1 A, 2, 10, 11,
331/46, 47, 50, 55, 56; 307/262, 465, 480, 219,
269, 602, 603, 601, 606; 328/155, 63, 72

[56] References Cited

U.S. PATENT DOCUMENTS

| | | | |
|---|---|---|---|
| 3,600,699 | 8/1971 | Orenberg | 331/2 |
| 4,239,982 | 12/1980 | Smith et al. | 307/219 |
| 4,282,493 | 8/1981 | Moreau | 331/2 |
| 4,500,851 | 2/1985 | Sawa et al. | 331/2 |
| 4,651,103 | 3/1987 | Grimes | 331/2 |
| 4,691,126 | 9/1987 | Splett et al. | 307/269 |
| 4,779,008 | 10/1988 | Kessels | 331/55 |
| 4,806,879 | 2/1989 | Troxel | 331/2 |
| 4,868,522 | 9/1989 | Popat et al. | 331/2 |

Primary Examiner—Timothy P. Callahan
Attorney, Agent, or Firm—Dickstein, Shapiro & Morin

[57] ABSTRACT

A phase-lock loop scheme which can be implemented in an application specific integrated circuit using CMOS elements is disclosed which is directed to controlling a plurality of slave gate array circuits such that each of the master gate array circuit and the slave gate array circuits are clocked at the same time and are within a fixed time delay from a device reference clock signal. The master gate array circuit receives the input clock synchronization signal from the master clock of the device containing the master and gate array circuits and produces an internal clock signal which is then sent to each of the slave gate array circuits, by means of equal delay paths. The phase-lock loop circuitry utilized by each of the gate arrays can be implemented on program logic array chips along with the logic which receives the synchronized clock signals generated by the respective phase-lock loops of each of the gate array chips. Both fixed and automatic gain and damping controls for the phase-lock loops are also disclosed.

20 Claims, 8 Drawing Sheets

DIGITAL PHASE-LOCK LOOP SYSTEM WITH ANALOG VOLTAGE CONTROLLED OSCILLATOR

BACKGROUND OF THE INVENTION

The present invention relates generally to digital phase-lock loop circuits. More particularly, the present invention relates to a digital phase-lock loop circuit which may be implemented on an application specific integrated circuit and which utilizes an analog voltage controlled oscillator.

While phase-lock loop circuitry in general is well known the present invention is designed to provide exact clock edge synchronization for a plurality of processing arrays. In such an application, it is desirable that the phase-lock loop circuitry be implemented using Complementary Metal Oxide Semiconductor techniques (CMOS) so that it can be implemented on integrated circuits together with the logic used with the arrays for receiving the synchronizing clock signals generated by the phase-lock loop circuitry.

The phase-lock loop circuitry of the present invention utilizes a 50 megahertz clock signal which is distributed for precision edge timing to each array. Each array utilizes a slave phase-lock loop to lock the 50 megahertz distributed signal within the array to the 50 megahertz signal entering each array from the master phase-lock loop circuit.

Phase-lock loop circuits implemented on MOS or CMOS integrated circuits have utilized wide-band MOS oscillators. Methods for the realization of such MOS oscillators with multi-decade tuning, range and gigahertz top speed are discussed by Mihi Banu in an article entitled "Design of High Speed Wide-Band MOS Oscillators for Monolithic Phase-Locked Loop Applications", published by the IEEE in ISCAS '88, pages 1673–1677. Another article published by the same author appeared in the IEEE Journal of Solid-State Circuits, Volume 23, Number 6, December 1988, at pages 1386–1393, and is entitled "MOS Oscillators With Multi-Decade Tuning Range and Gigahertz Maximum Speed."

The ISCAS '88 article relates to the design of a high-speed, wide-band MOS oscillator for monolithic phase-lock loop applications and discusses methods by which tunable oscillators with multi-decade frequency coverage and gigahertz top speed can be fabricated using MOS technology. The article also discloses relaxation network techniques which rely upon the use of parasitic timing capacitance, simplified feedback topologies and short-channel MOS devices. Certain digital-and-voltage-controlled-oscillator structure for use with complex monolithic phase-lock loop applications is also disclosed.

The later December, 1988 Banu paper deals generally with the same areas. While both Banu articles relate to oscillator circuitry utilized by the present invention, neither is concerned with the function of the present phase-lock loop circuitry, which provides exact clock synchronization for distributed clocking signals.

SUMMARY AND OBJECTS OF THE INVENTION

In view of the foregoing, it should be apparent that there still exists a need in the art for a method of and apparatus for implementing a phase-lock loop circuitry in which a 50 megahertz clock signal is distributed to a plurality of arrays which is distributed for precision edge timing to each array and in which each array has a slave phase-lock loop circuit which locks the 50 megahertz distributed clock signal within the array to the 50 megahertz clock signal entering each array. It is, therefore, a primary object of this invention to provide a method of and apparatus for synchronizing a plurality of arrays to a common clock signal utilizing a master and slave phase-lock loop scheme.

More particularly, it is an object of this invention to provide a phase-lock distribution scheme in which the phase-lock loop circuitry utilized to synchronize the clock pulses of a plurality of arrays is constructed such that it can readily be fabricated utilizing CMOS technology.

The present invention, which may be implemented in an application specific integrated circuit (ASIC) using CMOS elements, is directed to controlling a plurality of slave arrays such that they are each clocked at the same time and are each clocked within a fixed time delay from a reference clock signal produced by the computer system in which the arrays are situated. A master gate array receives the input clock synchronization signal from the master clock of the device containing the gate arrays and inserts an appropriate time delay to produce a 25 megahertz reference signal which is synchronized to the 25 megahertz synchronization signal which is received from the master device clock. The 25 megahertz signal is passed through a phase-lock loop to produce a 50 megahertz internal clock signal which is then sent to each of the slave gate arrays, by means of equal delay paths. Each of the slave arrays receives the 50 megahertz internal signal and, using a phase-lock loop contained within each slave gate array, processes that internal 50 megahertz signal such that each of the gate arrays is clocked on the exact same clock edge in relation to each other and to the master gate array.

The phase-lock loop circuitry utilized by each of the gate arrays can be implemented on, for example, program logic array chips using CMOS type components, along with the logic which receives the synchronized clock signals generated by the respective phase-lock loops of each of the gate array chips. Both fixed and automatic gain and damping controls for the phase-lock loops ar also described.

With these and other objects, advantages and features of the invention that may become hereinafter apparent, the nature of the invention may be more clearly understood by reference to the following detailed description of the invention, the appended claims and to the several drawings attached herein.

DETAILED DESCRIPTION OF THE PREFERRED EMBODIMENT

Figure 1:
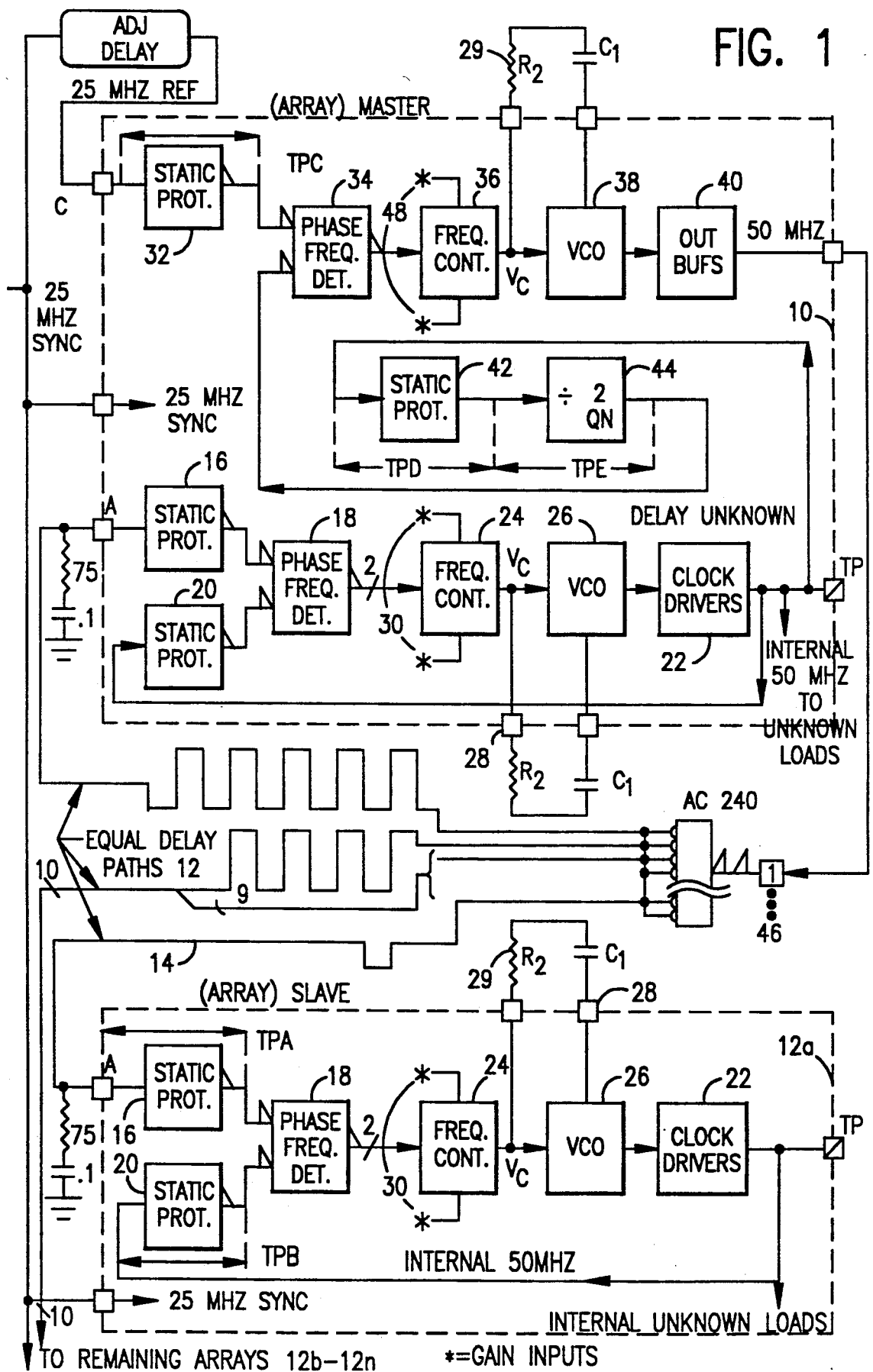
FIG. 1 is a schematic block diagram showing the overall circuitry scheme of the present invention.

Referring now to the figures wherein like reference numerals are used to indicate like elements throughout, there is shown in FIG. 1 the overall circuitry and clock distribution scheme of the present invention. FIG. 1 shows both a master array 10 and one of a plurality of slave arrays 12a–12n connected thereto. It should be understood that the circuitry of the present invention functions to synchronize both the master array 10 to each of the slave arrays 12a–12n as well as to synchronize the elements within each of the arrays 10 and 12a–12n within themselves. The description of the present invention starts with a discussion of the synchronization within a slave gate array 12a. A discussion of the synchronization between the master array 10 and each of the slave arrays 12a–12n follows.

The master array 10 generates a 50 megahertz reference signal as an output and transmits that signal to the slave array 12a by means of line 14. The 50 megahertz reference signal is input into the slave array 12a at point A. A 75 ohm terminating resistor is connected between point A and ground in order to reduce reflections and produce as pure a signal as possible. The 50 megahertz input reference signal enters the array 12a through a static protection device 16 typically used within gate arrays to protect against static discharges. The static protection device 16 also functions as an input receiver, inverter or amplifier that matches the signal level or sense of the incoming line 14 to that of the phase frequency detector 18.

In addition to performing the foregoing functions, the static protection device 16 also introduces a small time delay, referred to as "time for propagation A" or "TPA" in FIG. 1, into the 50 megahertz reference timing signal. The output from the static protection device 16 is then connected to the phase frequency detector 18.

The phase frequency detector 18 also receives a 50 megahertz internal timing signal through a second and identical static protection device 20. Both of the static protection buffers 16 and 20 have very low propagation delays themselves so that the difference in the two signals being fed to the phase frequency detector 18 approaches zero. The time delay caused by the static protection device 20 is referred to as "time for propagation B" or "TPB". The input signal to the static protection device 20 is produced from a sample of the 50 megahertz reference signal input to the array 12a that also goes to all of the other flip-flops within the gate array 12a and is shown on FIG. 1 as the internal 50 megahertz signal.

The internal 50 megahertz signal is provided to the second static protection circuit 20 from the clock driver circuitry 22. The clock driver circuitry 22 may be constructed of a plurality of buffer drivers operating in parallel in order to produce enough current to drive the numerous flip-flops contained in the gate array. The clock driver circuitry 22 itself has an unknown delay which can be much greater than the delay of the static protection circuits 16 and 20.

Each gate array 12a–n may include a test point TP which can be used for checking the operation of the clock driver system 22. Since the test point TP is connected to the output of the clock driver circuitry 22, connecting an oscilloscope probe to that test point would have very little effect on the circuitry of the gate array 12a since the clock driver circuitry 22 is driven with a low impedance.

The operation of the phase-lock loop within the gate array 12a is as follows. The internally generated 50 megahertz signal is fed to the static protection circuitry 20 while at the same time a 50 megahertz reference signal is fed to the static protection circuitry 16. The output from each of the static protection circuits 16 and 20 is fed to a phase frequency detector 18 which compares both the phase and frequency of the 50 megahertz reference signal to that of the internal 50 megahertz signal.

At its output, the phase frequency detector 18 provides two signals indicated with a 2 and a slash on the line connecting the phase frequency detector 18 and the frequency controller 24. The phase and frequency information is represented by a relatively low voltage, indicated by the use of a state indicator (flag) at the outputs of the static protection circuits 16 and 20 and the inputs of phase frequency detector 18.

The frequency control circuitry 24 receives the phase information output from the phase frequency detector 18, represented by the two logic low going signals. When one of the signals exiting the phase frequency detector 18 goes low, it indicates to the frequency controller 24 that there is a need for the frequency to be higher. When the other of the two logic low going signals goes low, that indicates to the frequency controller 24 that there is a need for the frequency to be lower. In the event that there is no need for a change in frequency, both of the signals output from the phase frequency detector 18 stay relatively high, at about 5 volts.

When there is a need to change the voltage, then the frequency controller 24 starts adjusting the analog voltage VC in order to control the voltage controlled oscillator or VCO 26. In a well known manner, a change in the input voltage to the VCO 26 causes a change in the frequency of the signal output from the VCO 26.

An output block connection 28 is connected across the line output from the frequency controller 24 to the VCO 26 so that an external capacitor C1 may be connected between the two terminals of that output block connection 28.

The external capacitor C1 is used to store the voltage VC generated by the frequency controller 24 in between frequency corrections. An external damping resistor R2 is connected as shown to control stability. Its function is explained in more detail later.

The frequency controller 24 may be a fixed resistor or an electrical component which acts like a resistor. In the preferred embodiment, CMOS transistors, which act like resistors, are utilized to realize the frequency controller 24. The gain in the frequency control circuitry 24 can be controlled by varying the signals applied to the gain inputs 30 of the frequency controller 24. The operation of those gain inputs will be described later herein in connection with the description of FIGS. 3A and 3B.

Referring now to the master array 10 shown in FIG. 1, it is illustrated how the phase-lock loop system is implemented to control synchronization between a number of different gate arrays 12a-n, by means of the master array 10. The master array 10 includes within it the synchronization circuitry utilized by each of the gate arrays 12a-n, namely the static protection circuits 16 and 20, the phase frequency detector 18, the frequency controller 24, the VCO 26, the clock driver circuitry 22, the capacitor C1 and the connecting block 28. That same circuitry contained in the master array 10 operates in the same fashion as that previously described in connection with the slave array 12a.

The master array 10, in the same manner as each of the slave arrays 12a-n, receives the reference 50 megahertz signal, as well as generates an internal 50 megahertz signal. The master array 10 operates as one of a group of gate arrays 10, 12a-n. It also controls the clocks within the master array 10, which clocks are utilized to generate each of the 50 megahertz reference signals used by both the master array 10 and each of the slave arrays 12a-n, as will be described hereafter.

The function of the master array 10 is twofold. First, the master array 10 provides a reference clock signal for each of the slave arrays 12a-n that are associated with it in order to keep them synchronized to each other. That function is accomplished by outputting a 50 megahertz reference signal from the output buffers 40. Since the delay of those output buffers 40 is unknown, the operation of the phase-lock loop system is designed to compensate for that delay. The 50 megahertz reference signal is used to drive a plurality of output buffers 46 which may be Model No. AC 240, which were originally designed by Fairchild and are now manufactured by National Semiconductor under the FACT series. A plurality of such buffer circuits form the output buffers 46. They are used in parallel with their outputs tied together. They are configured on printed circuit boards in which the output line from each buffer is parallel to and very close to the adjacent buffer output line. In the preferred embodiment, two IC packages would furnish 12 inverter sections driven by one inverter section to perform as 12 buffer circuits.

The output from each of the buffer circuits which make up the buffers 46 is a digital signal which goes from 0 to +5 volts. It is important that, as shown in the center of FIG. 1, each of the output lines from the buffers 46 are of as equal length as possible such that an equal distance path is maintained from the set of buffers 46 to each of the other ate arrays on a printed circuit board. Thus, as shown in FIG. 1, the upper output line is shown with more zigzags than the lower output line, in order to show that an equal distance path is constructed between the output from the buffers 46 and each of the arrays to which the output path is connected. In that manner, an equal delay path is created to each array. Obviously, the master array 10 may be located physically closer to the output of the buffers 46 than is the illustrated representative slave array 12a.

One method of achieving such equal delay paths on a printed circuit board is to run a few more lead lengths across the board for the path for the signal that comes back to the master array 10 since it might be closer to the buffers or drivers 46 than the slave array 12a. In that manner, the lengths of the leads are adjusted such that the length of travel of each creates a signal having approximately the same delay.

It is important that each of these signals have the same delay because it is the 50 MHz signal used as the reference signal that is downloaded into each of the gate arrays. However, any timing delay is affected by the lead path length. The signal must travel from the buffers 46 to the respective array.

Although only 12 output paths are shown from the buffers 46 in FIG. 1, any number of arrays, either master array 10 or slave arrays 12a-n, can be driven in this manner. Utilizing this system, all of the signals to the flip-flops used within each of the gate arrays 10 and 12a-n are synchronized to within a fraction of a nanosecond between each gate array. While it is preferable that each of the gate arrays be synchronized to within one-half of a nanosecond of each other, the present invention will operate properly if the gate arrays are synchronized to within at least one nanosecond of each other.

The second function of the master array 10, which is accomplished by the phase-lock loop which includes the frequency controller 36 and voltage controlled oscillator VCO) 38, is to maintain a predetermined phase relationship between the entire block of gate arrays 10 and 12a-n and some other set of circuit boards within the overall system, for example, a computer system or a portion of a computer system, such as a memory system. That function is accomplished by adjusting the phase that is produced within the master array 10 which is used by the master array 10 and comparing that phase to a 25 megahertz synchronization signal input to the master array 10. The 25 megahertz synchronization signal is produced by the master system clock controller of the computer system (not shown) in which the present invention resides, in a known manner. It can be referred to as a C input and is adjustable. Thus, the 25 megahertz synchronization signal is fed to an adjustable delay device 30 to produce a 25 megahertz reference signal which is then fed to the input of a static protection buffer circuit 32.

An adjustable delay circuit is utilized to synchronize the timing of the ate arrays to the larger system within which they are located, such as a memory system, since the gate arrays need to communicate with the memory within some fixed clock reference. Since it is initially not known quite what that exact relationship will be, the adjustable delay circuitry 30 is utilized in order to initially set the system relationship between the memory and the gate arrays.

After the 25 megahertz synchronization signal is suitably delayed to produce the 25 megahertz reference signal, the master array circuitry must still compensate for the delays of the output buffers 40, as well as the actual delay of the buffers 46. The phase-lock loop circuitry, which includes the frequency controller element 36 and the VCO element 38, is utilized to put the phase of all of the gate arrays at some known reference from the phase of the memory system for the entire computer system.

In order to produce the desired synchronization, the 25 megahertz reference signal is input at C to the master array 10 and then to the static protection circuitry 32. The 25 megahertz reference signal is utilized as a phase representation to which it is desired that the whole set of gate arrays will operate.

The output from the static protection buffer 32 is fed to one input of the phase frequency detector 34. The other input of the phase frequency detector 34 is derived from the internal 50 megahertz clock signal which is itself derived from the 50 megahertz signal output from the output buffers 40. After the internal 50 megahertz signal is passed through another static protection circuit 42, which produces a time for propagation D (TPD), the resulting signal is input to a divide by 2 counter circuit 44, which introduces an additional time for propagation delay E (TPE).

The output from the static protection buffer 32, which is input to the phase frequency detector 34, also has its own delay, which is referred to as time for propagation delay C (TPC). The purpose of the static protection circuit 42 is to approximately duplicate the delay created by passing the 25 megahertz reference signal through the static protection buffer 32. Although the static protection circuit 42 is not necessary for static protection, the static protection buffer 32 is necessary for static protection and, thus, it is not possible to avoid the delay C created in the 25 megahertz reference signal by passing it through the static protection buffer 32.

The phase frequency detector 34 compares both the phase and the frequency of the delayed 25 megahertz reference signal and the internal 25 megahertz signal created by dividing the internal 50 megahertz signal by 2. The comparison of the divided internal 50 megahertz clock signal to the phase reference of the signal output by the adjustment delay 30 or 25 megahertz reference signal produces two correcting signals which are utilized by the frequency controller 36 to set the VCO 38 and the output buffers 40 to whatever phase is needed in order to maintain the desired phase of the sampled internal clock to the 25 megahertz reference signal coming in to the master array 10.

As previously described, the internal 50 megahertz clock signal is representative of the phase at which all of the arrays 10 and 12a-n are being clocked. After dividing that internal 50 megahertz signal by 2, it is compared to the 25 megahertz reference signal and the result controls the frequency of the VCO 38 to adjust both the frequency, and then the phase, of the output of the VCO 38. In that manner, the phase lag or distortion produced at the output buffers 46 plus the delay of the buffers or drivers 46 is compensated for such that the accumulated phase delay of the 50 megahertz reference signal at point A in each of the arrays 10 and 12a-n will produce an internal 50 megahertz clock signal that has an identical phase delay within a fraction or within one nanosecond of the 25 megahertz reference signal input into the master array 10.

In the manner described above, the circuitry of the present invention operates to synchronize each of the individual arrays to each other such that the output from the master array VCO 38 will influence the clocking reference signals received by each of the arrays 10 and 12a-n in an identical manner. Therefore, each of the arrays 10 and 12a-n will be in the exact same phase relationship to the 25 megahertz reference signal generated from the 25 megahertz synchronization signal received from, for example, the memory system of the computer system within which the gate arrays 10 and 12a-n are operating. Thus, whenever the phase or the frequency output from the master array VCO 38 is adjusted up or down, the phase or frequency of the clock signal input to all of the arrays 10 and 12a-n will be adjusted up or down in exactly the same manner. Since all of the gate arrays 10 and 12a-n are all locked to the same reference signal, they will be locked to the same phase and therefore will be locked to the 25 megahertz reference signal input into the master array 10.

The gain inputs 48 of the frequency controller 36 help to stabilize the frequency controller and to prevent it from over-correcting during the operation of the phase-lock loop within which the frequency controller 36 is located. The gain inputs 30 of the frequency controller 24 located on each of the gate arrays 12a-n operate in a similar fashion. In the simplest embodiment, voltage divider resistors, as shown in FIG. 5, may be utilized to control the gain across the frequency controllers 24 and 36, as will be described in connection with FIG. 5.

Figure 5:
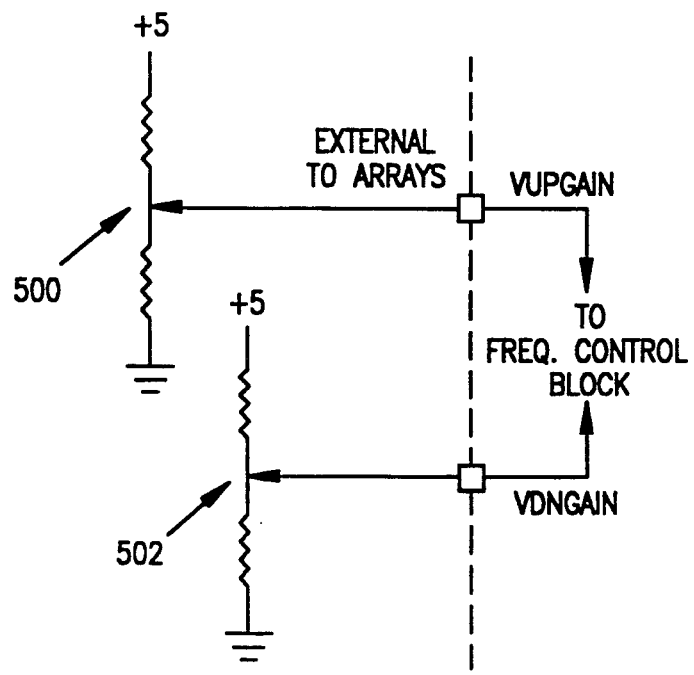
FIG. 5 is a schematic diagram showing the manual gain control without mirroring circuitry for use with a preferred embodiment of the frequency control and voltage controlled oscillator circuitry of FIG. 3A.

Alternatively, a more sophisticated automatic gain and damping function control can be utilized in place of the voltage divider resistors shown in FIG. 5. The use of such an automatic gain control and damping function provides the advantage of eliminating the requirement of finding the necessary gain value, as well as providing a connection for the voltage divider resistors or capacitors, needed for a permanent gain setting. Construction of these components to any precision using digital type IC technology is particularly difficult. FIGS. 6 through 10 show the logic circuitry which can be utilized to accomplish the automatic gain and damping control function. Each of those figures is described later herein.

Figure 2:
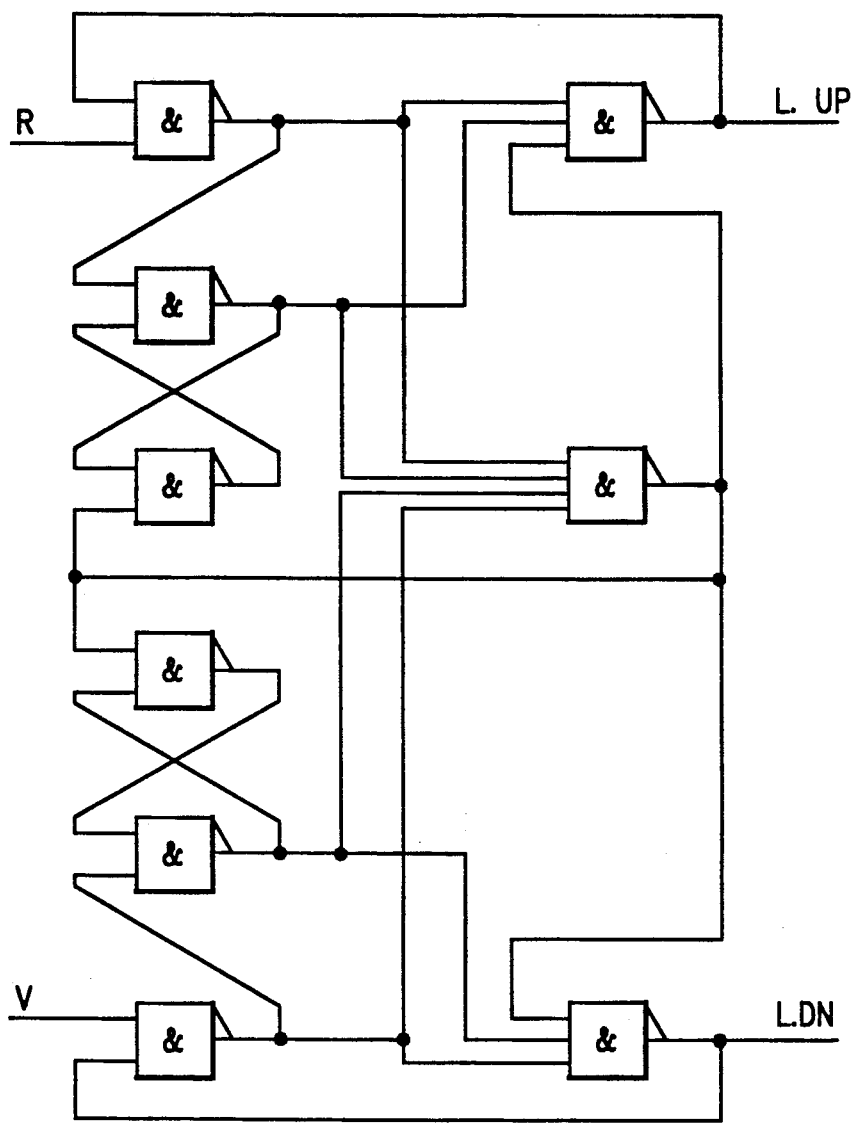
FIG. 2 is a schematic diagram of a known phase-frequency detector which may be utilized with the circuitry of FIG. 1.

FIG. 2 shows the circuitry for a typical well known phase frequency detector which may be utilized as the phase frequency detectors 18 and 34 in FIG. 1. The phase frequency detector shown in FIG. 2 has been named such because it provides both phase error signals as well as frequency correcting signals when a loop as shown in FIG. 1 is out of lock. Waveforms of the phase frequency detector operation are given in the Motorola Device Data Book, "Phase Frequency Device" No. MC4344.

Figure 3A:
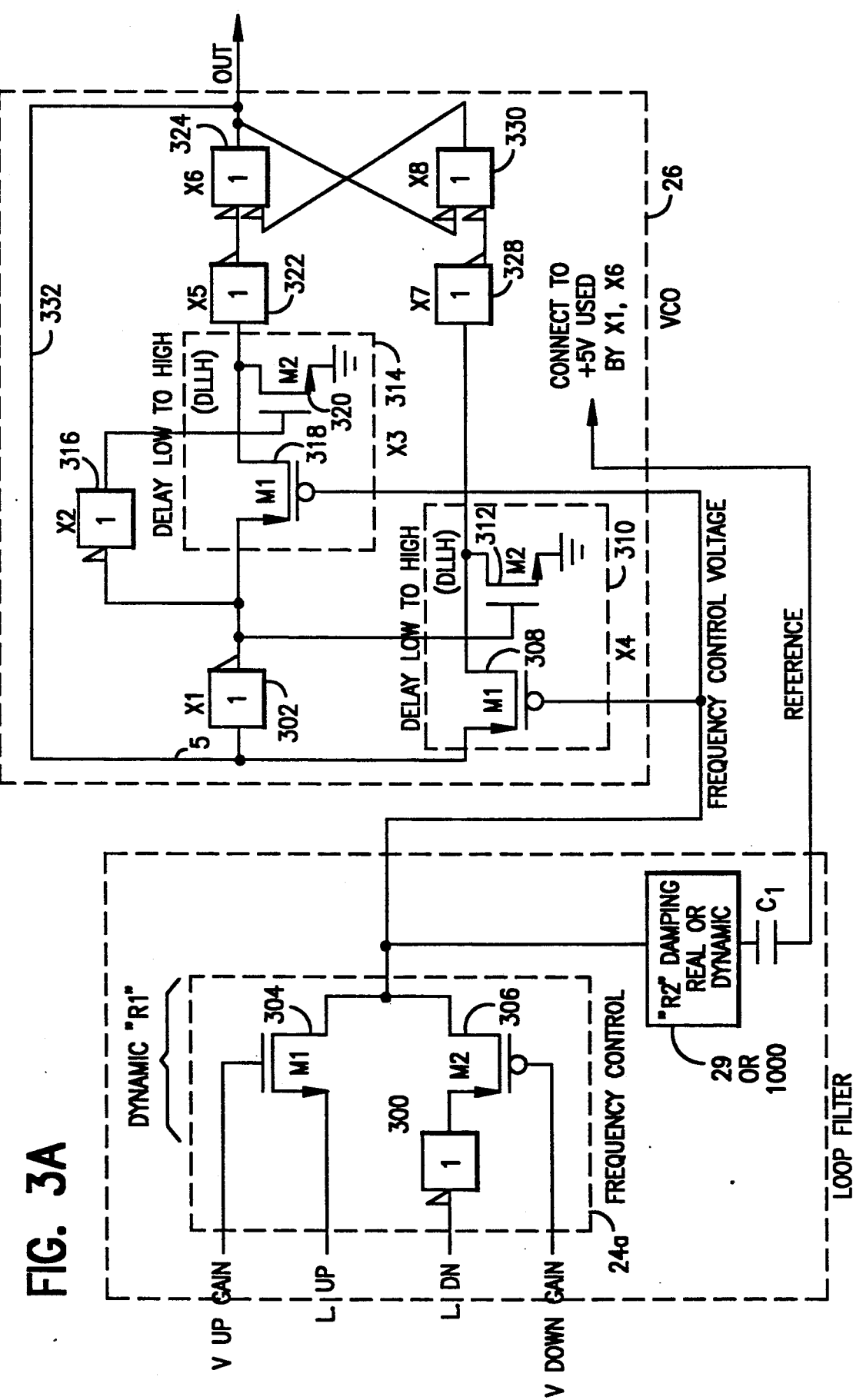
FIG. 3A is a schematic diagram of the frequency control and voltage controlled oscillator circuitry for use with the circuitry shown in FIG. 1.
Figure 3B:
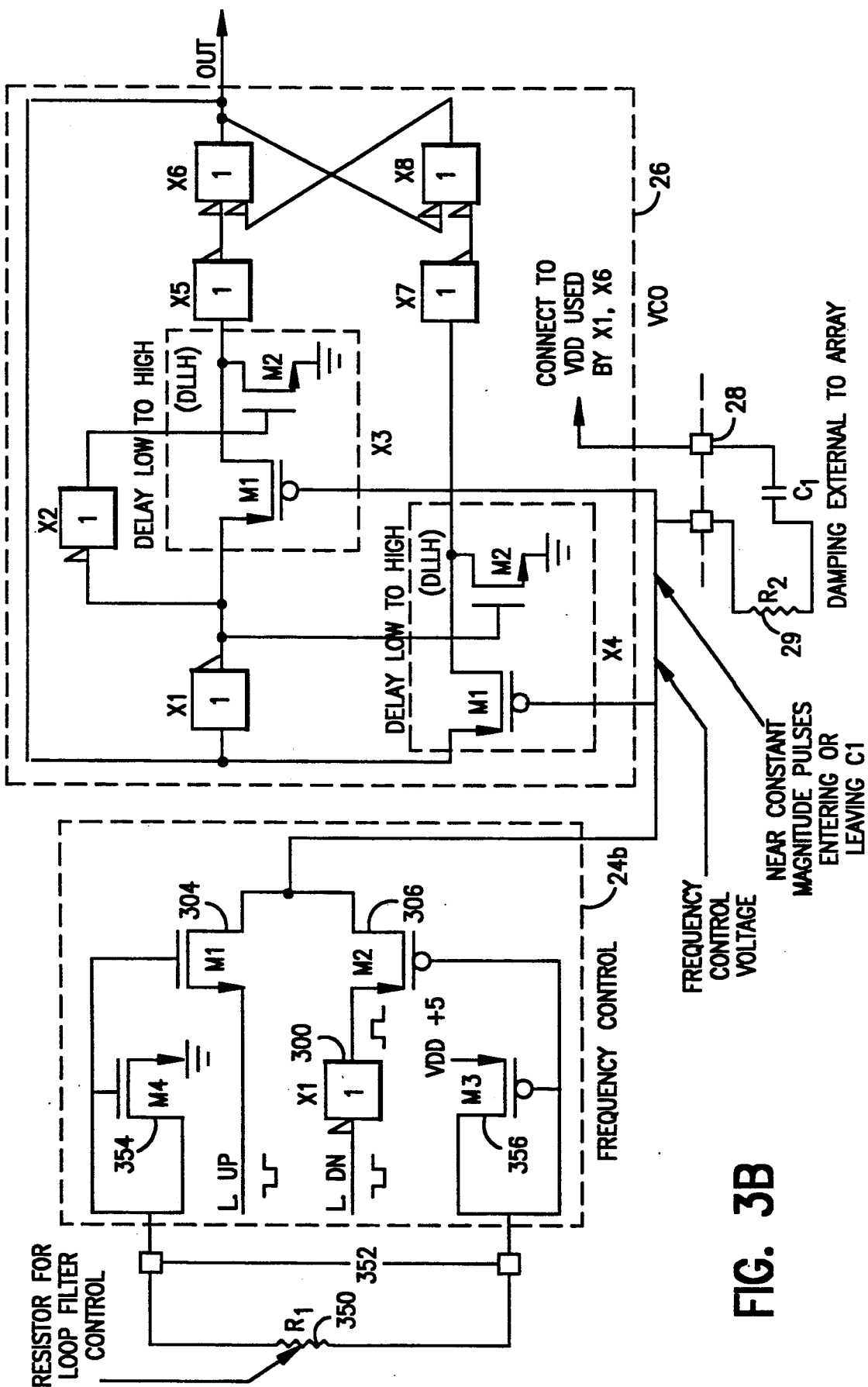
FIG. 3B is a schematic diagram of an alternative embodiment for the frequency control and voltage controlled oscillator circuitry for use with the circuitry of FIG. 1, which uses mirroring techniques.

FIGS. 3A and 3B show the circuitry of the frequency control circuitry 24, the damping control blocks (29 or 1000) and VCO circuitry 26, with their interconnections. The frequency control circuitry 36 and connected VCO 38 shown in the master array 10 in FIG. 1 may also be constructed from the frequency control circuitry 24a and voltage controlled oscillator circuitry 26 shown in FIG. 3A. The frequency control circuitry 24a is formed primarily by two CMOS transistors M1 and M2. Those transistors have their drains interconnected. That interconnection is the point from which the control voltage to be fed to the VCO 26 is derived.

The transistors M1 and M2 both regulate current input through them when turned on and act as isolating diodes when turned off. They control the quantity of charge placed on the external capacitor C1 for each correction pulse received from the phase frequency detector 18, 34 connected to the frequency control circuitry 24a. The capacitor C1 holds the resulting voltage which controls the charging of the transistor M1 of X3 and X4 in the VCO 26. The capacitor C1 may preferably be referenced to an internal voltage +5 V (or VDD), representing the voltage that the source of the transistor M1 of X3 and X4 switches to when the outputs of the inverters 302 and 324 go high. That reduces the common mode noise that would ordinarily result if the capacitor C1 was connected to a ground outside of the array 10, 12a-n. By controlling the current for charging the capacitor C1, the frequency control circuitry 24a controls the frequency of the VCO 26, as previously described. FIG. 3A shows the components arranged and identified using R1, R2 and C1 within a loop filter block as is often shown in PLL literature.

The frequency control circuitry 24a receives two signals from its respectively connected phase frequency detector 18, 34, namely L.UP and L.DN. The L.UP signal is fed to the source of the transistor M1 while the L.DN signal is first inverted by inverter 300 and then fed to the source terminal of the transistor M2.

The gate terminal of each of the respective transistors M1 and M2 has applied to it a voltage which is used to control the gain of the frequency controller 24a. A voltage up gain signal is applied to the gate of transistor M1, while a voltage down gain signal is applied to the gate of the transistor M2. The use of such voltage gain signals has been previously described.

The output from the interconnected drains of the transistors 304 and 306, in addition to being fed to the interconnection block 28 (see FIG. 3B, showing external components) and thence through C1 to the VDD supplied to the inverters 302 and 324, is also connected (via the frequency control voltage line) to the gate of the CMOS transistors 308 and 318. The transistor 308 is part of a delay low to high (DLLH) circuit 310 while the transistor 318 forms part of a similar delay low to high (DLLH) circuit 314. The function of both of the delay circuits 310 and 314 is to control the current output from each respective delay circuit to its respective inverter 328 and 322.

In the case of the delay circuit 314, when the voltage represented, by the voltage on the capacitor C1 enters the delay circuit by means of a connection between the gate of the transistor 318 and the output of the frequency controller 24a, it sets the gate voltage for the transistor 318. The transistor 318 is thus turned on, but only very slightly. In effect, it acts like a resistor in an analog circuit such that it is charging the capacitance represented by its drain and the circuitry connected to that drain. Thus, under initial conditions, the inverter 302 outputs a high signal of about 5 volts into the source of the transistor 318. Some voltage below +5 volts will also turn on the transistor 318 slightly and cause it to dump current into its drain, thus charging up the drain of the transistor 318.

The current from the source of M1 charges both the drain of the transistor 318 and the drain of a second transistor 320, which also forms part of the delay circuit 314, as well as being input into 322. In that manner, a slight and very small capacitance is effectively charged because the transistor 318 is conducting a current from its source to its drain and into the inverter 322. That capacitance is being charged at a rate that is determined by the voltage on the capacitor C1. Thus, the lower (less positive) the voltage on the capacitor C1 connected to the frequency control line, the less time the charging up takes and therefore the frequency of the signal output from the VCO 26a will increase. A lower voltage on the external capacitor C1 at the external block 28 means more of a voltage difference between the gate of the transistor 318 and its source, which is at +5 volts during this action.

If the voltage stored in the capacitor C1 connected to the frequency control voltage line is more positive than the situation discussed above, there will be less of a difference between the gate and source of the transistor 318 and thus that transistor 318 will not conduct as fast. Therefore, not as much current will be conducted by the transistor 318 in a given time period so that the entire voltage on the capacitor C1 represents a lower frequency than before. An actual corresponding frequency is represented by the instantaneous voltage on the capacitor C1 because it controls the charging rates of the transistor 318 of the delay low to high circuit 314 and the transistor 308 of the delay high to low circuit 310.

It should be understood that capacitor C1 connected to the external connection block 28 may be a discrete component. Alternatively, it could be formed by some component that would produce a capacitance on the integrated circuit configured as the voltage controlled oscillator 26 such that the VCO 26 could operate without having an external capacitor and connection block as shown in FIG. 3A. In any event, however, the inherent capacitance of the drain of the transistor 318 and that of the drain of the transistor 308 is utilized to control the output frequency of the VCO 26. The output frequency of the VCO 26 is controlled by how fast those capacitances are charged.

The NAND circuits 324 and 330 form a flip-flop such that a low going input to the NAND gate 324 will cause a true one state at the VCO 26 output, and a low going signal into NAND gate 330 will reset the flip-flop back to a default or off state. When the output of the voltage ramp from the delay low to high circuit 314 reaches some threshold voltage of the inverter 322, then the inverter 322 will produce the low signal that will cause the flip-flop formed by the NAND gates 324 and 330 to go into its set state. When that occurs, the output of the flip-flop is set high and is fed back to the inverter 302 by means of line 322 which is connected between the output of the VCO 26, the input to the inverter 302 and the source of the transistor 308 which forms part of the delay low to high circuitry 310.

If the voltage ramp exiting from the delay low to high circuitry 314 has just reached the threshold at which it makes inverter 322 switch (at approximately 1-2 volts) and has set the output of the NAND gate 324 high, then the inverter 302 receives that high signal and its output goes low. Therefore, when the delay low to high circuit 314 is no longer being charged, the delay low to high circuitry 310 starts being charged and that circuit 310 begins to output a ramp function since the transistor 308 is then receiving a high signal on its source. Of course, the transistor 308 is also receiving the control voltage signal from the frequency controller 24a.

The transistor 308 then becomes the ramp charging source for charging the ramp and charges the capacitance on the input to the inverter 328. The drains of the transistors 308 and 312 are capacitively charged as well. In a manner similar to that previously described with respect to the delay low to high circuitry 314, the capacitor equivalent formed by the transistors 308 and 312 is charged by the current that goes to the transistor 308 that is controlled by the voltage of the external capacitor C1 connected to the external block connection 28 so that the ramp voltage produced at the output of the delay low to high circuitry 310 again controls the frequency of the oscillation within the voltage controlled oscillator 26. In that case, the delay low to high circuitry 310 controls the charging rate for one phase of the main output of the VCO 26 while the charge rate for the delay low to high circuitry 314 controls the other phase of the main output of the voltage controlled oscillator 26. In that manner, the output from the delay low to high circuit 314 rises to 1 and then the other delay low to high circuitry 310 takes over and rises to 1, in such a manner, that the operation of the two delay low to high circuits 314 and 310 operates to alternately converge the output of the voltage controlled oscillator at the desired frequency. Transistors M2 in each of the low to high circuits serve to discharge the drain capacitance rapidly after each timing ramp.

An advantage of the type of circuitry described above in connection with the voltage controlled oscillator shown in FIG. 3A is that the duty cycle of the output of the VCO 26 can readily be controlled. In a manner as just described, either an exact 50% duty cycle is produced or a duty cycle slightly set off from 50% can also be produced, in order to compensate for other distortions that might take place in the driver circuitry. This type of arrangement would need two phase frequency detectors as part of the phase-lock loop system; one to detect high going clock edges, one to detect low going clock edges. However, there would be less need to double the clock frequency, the method usually used to avoid phase duty cycle sensitivity. In FIG. 1, only a single phase frequency detector 34 is utilized.

FIG. 3B shows an alternate embodiment of the frequency control and voltage controlled oscillator circuitry of FIG. 3A, using mirroring techniques to control the frequency controller 24b. The frequency controller 24b of FIG. 3B utilizes an external resistor 350 which provides a manual way to control the frequency and have only one control for maintaining a uniform up and down correcting rate, using only a single resistor. With the resistor connected to the pads 352 representing connections to the output of the gate array in which the frequency control and voltage controlled oscillator of FIG. 3B are resident, the connection of the resistor 350 across the connection pads 352 causes a certain amount of DC current to be drawn from the VSS (internal ground) to which the source of the transistor 354 is connected. The DC current also comes from the VDD+5 V source through the source and drain of the transistor 356, through the resistor R1 and then through the drain and source of the transistor 354 and back to the VSS voltage.

Once that current flow is created, the current flow through the resistor R1 causes the gate of the transistor 354 to reach some voltage which would tend to turn the transistor 354 on harder, and with lower resistance. However, when the current reaches a certain point, the transistor 354 will not turn on anymore and will thus limit the voltage at its gate. The transistor 354 therefore reaches a stabilizing voltage between its gate and its source.

An identical action occurs with regard to the operation of the transistor 356 since the same current circulating from VDD flows through both transistors 354 and 356. Thus, the identical current is applied to both of the transistors 354 and 356 and the voltage on the gate of the transistor 354 and its source are such that they produce that identical current for each of the transistors 354 and 356.

Once the voltage is set for the gate and the source for the transistor 354, that voltage is reflected into the transistor 304 because, when the source for the transistor 304 goes low, the low going signal is turned on with a very low resistance with regard to the voltage VSS. That is, the voltage VSS is active when the transistor 304 goes low.

In the same manner, when the transistor 356 starts to turn on, it goes to the level of the voltage VDD which is the output from the inverter 300 which is applied to the source of the transistor 306.

When the transistor 354 is turned partially on, it regulates its gate voltage as explained above. Since its gate is tied to the gate of the transistor 304, and they are both N-channel transistors, when they get the same voltage between their gates and sources, then the current at the drain of the transistor 304 is nearly identical to the current that is passing through the transistor 354. Since the current passing through the transistor 304 is the same as the current that came through the resistor 350 from the transistor 356, the source to gate voltage for the transistor 306 becomes identical to the source to gate voltage for the transistor 356. Thus, the transistor 306 will provide a current out through its source because its gate to source voltage is made almost the same as that of the transistor 304. Thus, the transistor 306 provides the same source to drain current as the transistor 304. In effect, each of the transistors 304 and 306 mirroring each other.

The resistor 350 therefore controls the frequency correcting rate for a given phase error detected. Using a single resistor 350, the identical current output is produced from either of the transistors 304 and 306. However, only one or the other transistor may act at any one time to signal a frequency or phase change. As previously described, the VCO 26 operates to produce that change in its output. For additional information regarding the traditional analysis of phase-lock loops, reference is made to the publication "Phase-Locked Loop Techniques" by Floyd M. Gardner, published by John Wiley & Sons, Inc., N.Y., Second Edition, 1974.

Figure 4:
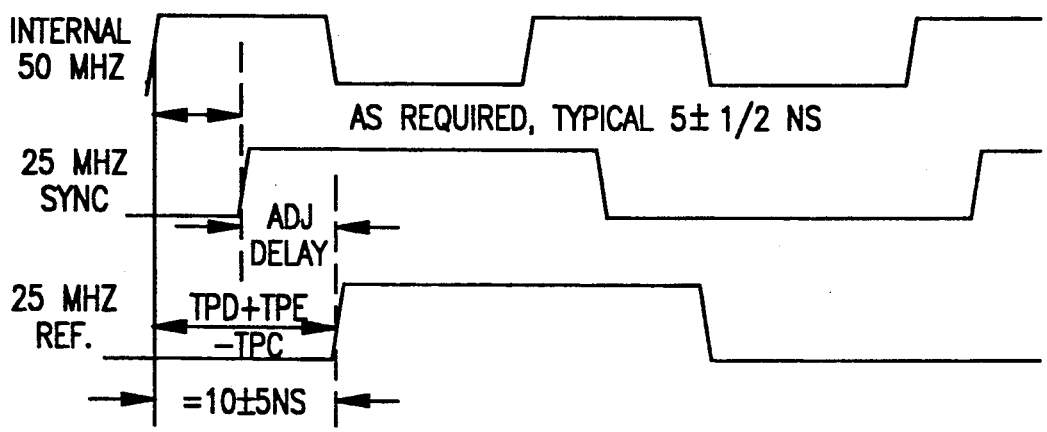
FIG. 4 is a schematic diagram illustrating the interrelationship between the various clock pulses utilized with the present invention.

FIG. 4 represents a typical timing requirement diagram obtained utilizing the clock distribution scheme shown in FIG. 1. The top curve shows the internal 50 megahertz reference signal which is produced in the master array 10 and distributed to each of the slave arrays 12a-n. The 50 megahertz internal signal, it will be recalled, is provided to the static protection circuitry 20, and during loop lock should be identical to the reference signal entering the static protection device 16.

The middle curve in FIG. 4 shows the 25 megahertz synchronization signal which is fed through an adjustable delay circuit 30 and represents the timing of the circuitry external to the master array 10 and slave arrays 12a-n, as previously described. That signal typically would be provided by a central system timing circuit or at the direction of the memory. The adjustable delay circuitry 30 is adjusted until a desired required reference delay is obtained between the 25 megahertz synchronization signal and the 25 megahertz reference signal to which the master array 10 and slave arrays 12a-n are synchronized.

Figure 6:
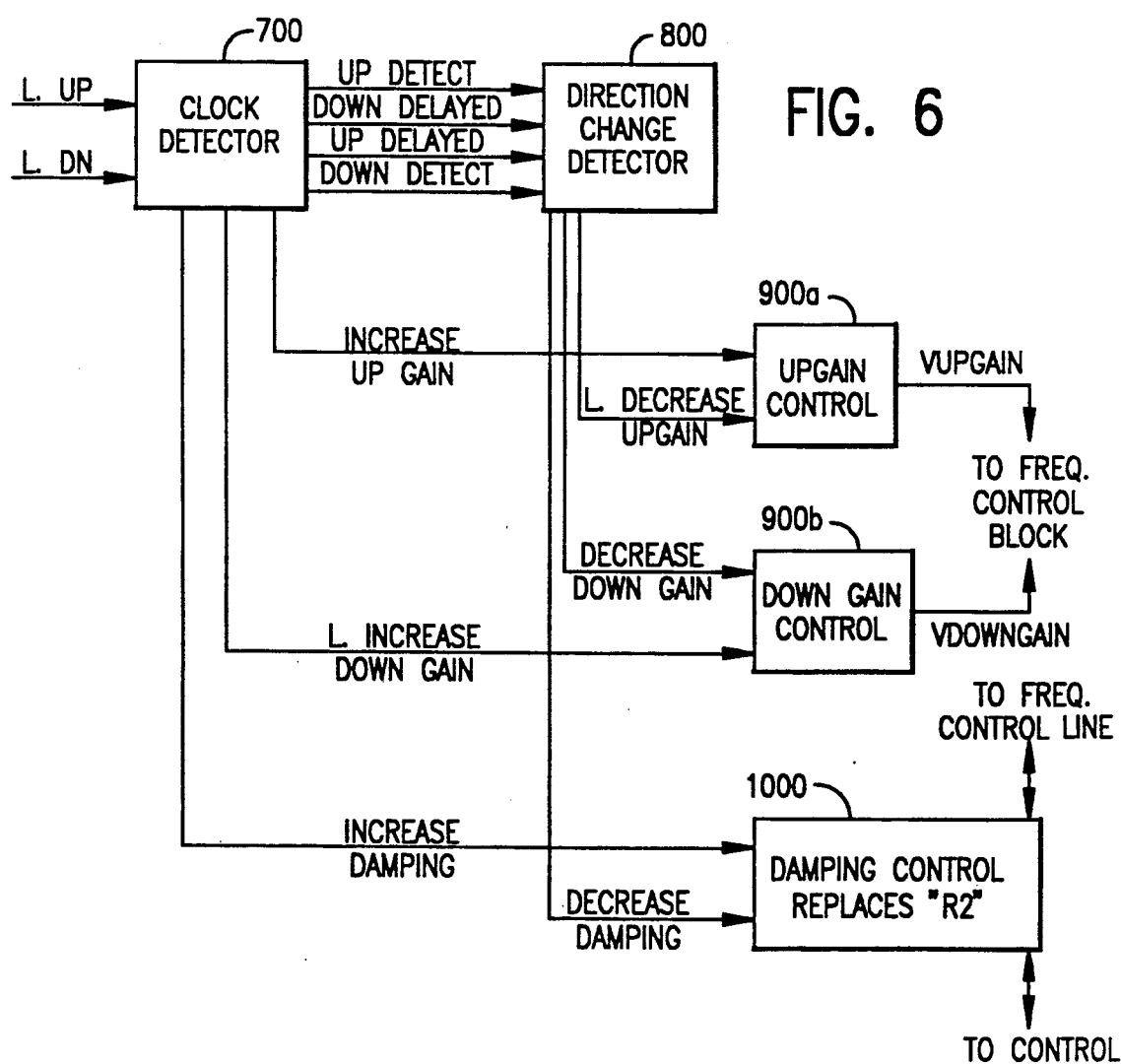
FIG. 6 is a schematic block diagram of the auto-gain and damping control system for use with the alternative frequency control and voltage controlled oscillator circuitry of FIG. 3A.

FIG. 6 shows an alternate gain and damping control circuit for use with the frequency control and voltage controlled oscillator circuitry of FIG. 3A in which the gain and damping has been designed to be automatic. The circuitry of FIG. 6 eliminates the necessity of the external resistors 500 and 502 (shown in FIG. 5) for controlling the gain of the frequency controller 24a. The external damping resistors 29 are also eliminated. The gain produced by the auto-gain and damping control circuitry of FIG. 6 controls the correction rate of the changing input voltage (possibly including some crosstalk noise) that changes frequency.

The auto-gain control circuit shown in FIG. 6 functions to determine the correction rate by examining the actual performance of the phase-lock loop during operation and, in an almost continuous manner, changes the up gain and down gain correction rates by effectively changing the value of the resistance "R1" in PLL literature) represented by the effective resistance of the transistors 304 and 306 of the frequency controller 24a.

The L.UP and L.DN signals which provide the input to the circuitry of FIG. 6 are produced at the output of the phase frequency detector shown in detail in FIG. 2. The clock detector circuit 700 is shown in detail in FIG. 7 and the direction change detector circuit 800 is shown in detail in FIG. 8. The up and down gain control circuits 900a and 900b are shown in FIG. 9. By examining the output of the phase frequency detector 18, 34 and determining the performance of the phase-lock loop, the up and down correcting rates are effectively changed by changing the value of the effective resistance of the two transistors 304 and 306, that is, the resistance between the drain and source for each of those respective transistors. The effective resistance ("R2" in PLL literature) of another MOS transistor is regulated to control damping and insure stability.

The function of the auto-gain and damping circuitry is as follows. When a series of error pulses from the phase frequency detector enters the clock detector before the loop is finally operating with acceptably small errors, the errors are large and grouped for a single direction. Assume that a series of L.UP signals arrive. Each one will generate an UPDETECT and INCREASE UPGAIN signal causing the upgain control to adjust the VUPGAIN voltage for more gain. An initial series of L.DN PULSES would ADJUST the VDOWNGAIN voltage. Since the quantity of correction pulses is initially large, counters in the clock detector also generate INCREASE DAMPING signals, but far fewer, to increase the damping. Later corrections will readjust damping when needed.

The direction change detector 800 is used to detect when full width and strength error pulses for one direction follow immediately after similar correction pulses for the other direction. When either condition is detected, the appropriate L.DECREASE UP GAIN or DECREASE DOWN GAIN signal is generated to allow the corresponding VUPGAIN, or VDOWNGAIN voltage to adjust for lower gain. Either direction change will generate DECREASE DAMPING signals.

The specific gain control circuitry, shown as elements 900a and 900b in FIG. 6, is shown in detail in FIG. 9. Two such gain control circuits, identical to each other, are utilized. Each gain control circuit is used to generate the up and down gain voltages to be applied to the transistors 304 and 306. Two circuits allow for individual adjustment compensation needed for differences between N-channel and P-channel transistors, differences which can be more pronounced with processes designed for digital circuits. The operation of the gain control circuitry of FIG. 9 will be discussed hereinafter.

Figure 7:
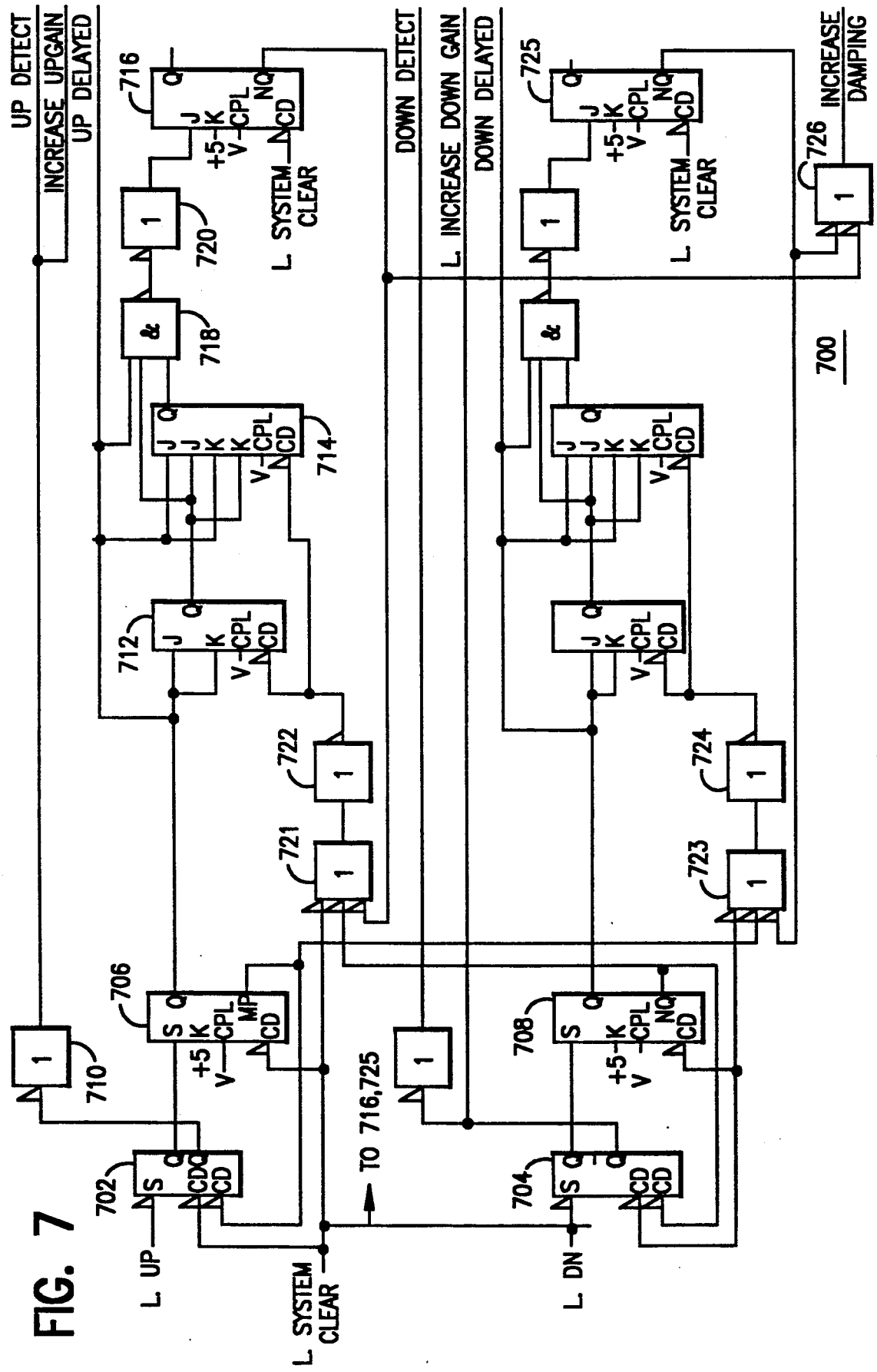
FIG. 7 is a schematic diagram showing the clock detector circuitry for use with the automatic gain control and damping system shown in FIG. 6.

Referring now to FIG. 7, which shows the details of the clock detector 700, the L.UP and L.DN signals from the phase detector shown in FIG. 2 are fed to a first pair of flip-flops 702 and 704 respectively. Those two incoming signals are low going and are usually of both very small amplitude and short duration but are sufficient for controlling the voltage on the capacitor C1 connected to the external connection pads 28, and thus for controlling the frequency of the output voltage from the VCO 26. However, if the those differences between the VCO and a reference become very large, there will be phase correction signals that approach a full nanosecond or more.

The purpose of the phase detector shown in FIG. 2 is to detect those signals that are sufficient not only to make an immediate frequency correction but to change the performance of the phase-lock loop shown in FIG. 1. That is accomplished by providing the L.UP and L.DN signals to the clock detector 700. The clock detector 700 looks at those two signals and, if they reach a certain voltage and duration threshold presented by the inputs to the DC flip-flop 702, that flip-flop 702 will be set. The flip-flop 702 represents two NAND gates connected together, one two input NAND gate and one three input NAND gate. Essentially, that flip-flop has two clear inputs and one set input. Thus, when a low going signal representing some correction needed to the loop performance reaches the threshold, it will set the DC flip-flop 702. When that DC flip-flop 702 is set, its Q output goes high, providing an output to a J-K type flip-flop 706. Each of the J-K type flip-flops 706 and 708 is clocked by the low going edge of a signal V, the main output signal from the VCO 26. The V signal is applied to a CPL input of the J-K type flip-flops 706 and 708.

If enough of a correction signal L.UP is present at the first detector flip-flop 702, it will set that flip-flop and it will stay set until it is later cleared. Once that flip-flop 702 is set, then the output of the VCO 26, which is applied to the CPL input of the J-K flip-flop 706, sets that flip-flop 706 which means that a sufficient correcting signal within a full clock period has been detected.

The K input of the flip-flop 706 is tied to +5 V, representing a one. With both J and K at one, the flip-flop 700 resets on the next active edge of the clock signal V. Therefore, the Q output from the flip-flop 706 will provide full clock cycle pulsing for reliable counting. The low output from NQ of the flip-flop 706 resets the flip-flop 702. An inverter 710 is connected to the NQ output of the DC flip-flop 702 which produces an UP DETECT signal which lasts until the DC flip-flop 702 is cleared. For each full clock cycle associated with a full strength correction signal detected, the clock detector circuitry 700 can then count its occurrence.

The J-K flip-flops 712 and 714 function as the counter for the occurrences described above. The output from the VCO 26 is applied to a CPL input of each of those flip-flops 712 and 714, enabling them to count synchronously. The output of the NAND gate 718, sensing a counter state of three and a new true state of the flip-flop 706, is inverted by 720 [WHERE IS THIS ELEMENT ON FIG. 7?] so that the flip-flop 716 will be clocked true on the count of four. That count represents that several strong correction signals in the same direction have been received.

The NQ output signal of the flip-flop 716 is fed down to the NAND gate 726, which produces an output signal INCREASE DAMPING, and also provides a logic low signal back to the NAND gate 721 which then causes the inverter 722 to provide an active low signal to the counter stages 712 and 714, resetting them to zero. The resetting action lasts one full clock period because the K input to the J-K flip-flop 716 is tied to the +5 V, representing a one or true input used to reset that flip-flop when the clock signal V active edge occurs again.

Circuitry similar to that just described is provided, as shown in the bottom half of FIG. 7, which also activates an output INCREASE DAMPING signal. In addition, provision is made such that, when there is a counting of signals in one direction, the counter for the opposite direction is cleared and inhibited from counting. That is accomplished (noted here for only one direction) by the low signal from the NQ output of the flip-flop 708 connection up to the NAND gate 721, which causes the resetting of the counter stages 712 and 714, as explained for the flip-flop 716. Therefore, when correction signals are continually being generated but too few of the strong ones reach a certain minimum quantity in one continuous direction (four for the counter as shown), the respective up and down signal counters are reset and neither counter generates an INCREASE DAMPING signal. If some special noisy design created longer patterns of pulses that had to be tolerated without changing the loop characteristic, then the counter would be designed larger. The active counter resetting action included and as already explained makes expansion easier. Binary number counters like the 2 bit counter shown in the figure do not really need to be reset when reaching maximum because their next natural counting state is zero.

The L.SYSTEM CLEAR signal is routed to the CD (direct clear) inputs of all flip-flops except the counters. It is also connected to gates 721 and 723. Then, when the L.SYSTEM CLEAR signal is low, all flip-flops are cleared to a zero state. The ate 721, 723 acts through inverter 722, 724 to provide the clearing low signal to the counter flip-flops. The gate 721 also transmits the detection signal to the flip-flop 716 when the counter using the flip-flops 712 and 714 has counted the threshold number of pulses so that the counter may be cleared to zero, or to clear the counter when the flip-flop 708 indicates that a down correction counting action is starting. The gate 723 performs a symmetrical function to that of gate 721.

Figure 8:
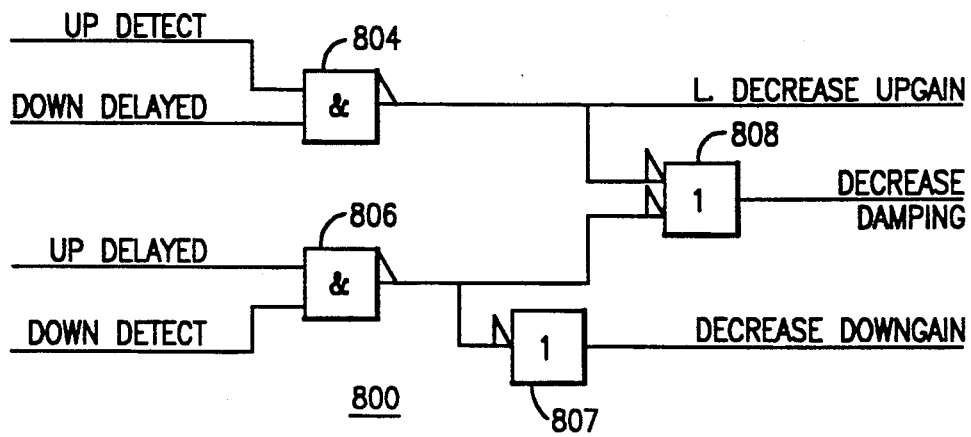
FIG. 8 is a schematic block diagram of the direction change detector for use with the auto-gain control system shown in FIG. 6.
Figure 9:
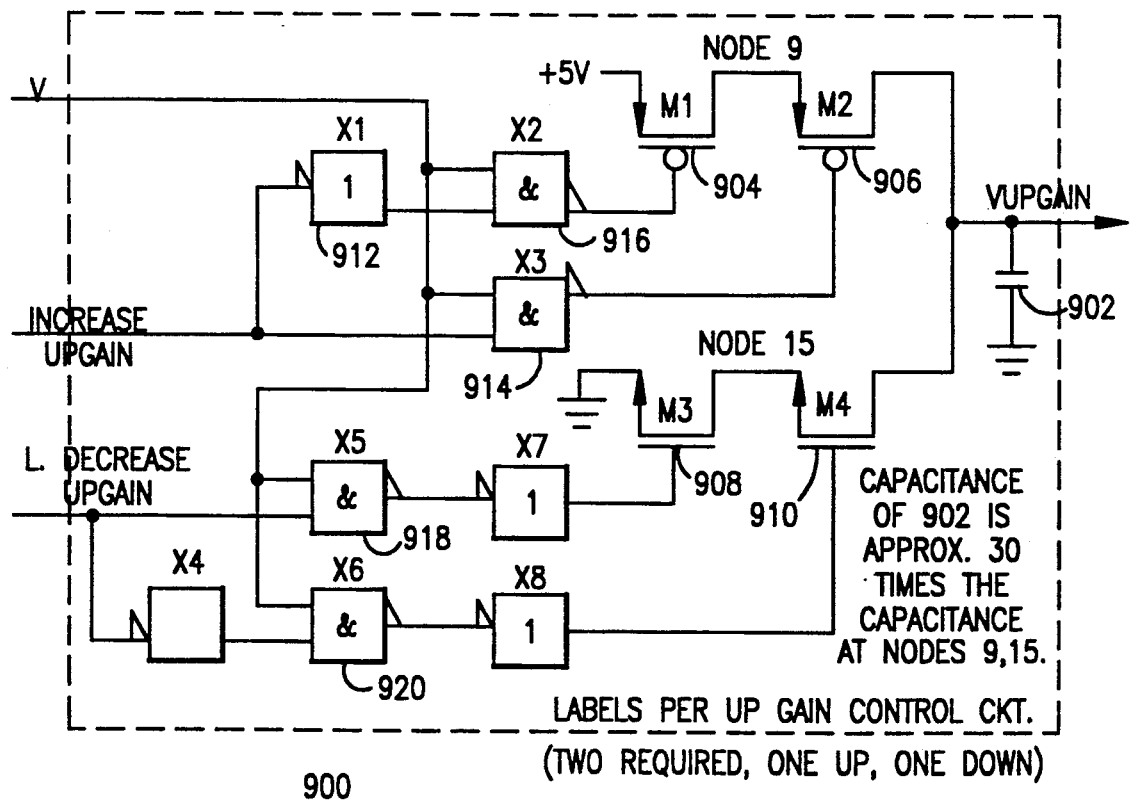
FIG. 9 is a schematic block diagram of the gain control circuit for use with the auto-gain and damping control system shown in FIG. 6.

The direction change detector 800 is shown in FIG. 8. It receives the UP DETECT, UP DELAYED, DOWN DETECT and DOWN DELAYED signals from the clock detector 700. The direction change detector 800 provides the signal to decrease the up or down gain, and decrease damping.

In operation, the direction change detector 800 works as follows. If there is an immediate down detection after an up detection, the direction change detector 800 recognizes that condition to mean that there is a need to decrease the down gain since it indicates an unstable situation. An UP DELAYED signal indicates that the last correction was a strong up. Then, if a DOWN DETECT signal comes in while the UP DELAYED signal is still true, the gate 806 becomes activated and the inverter 807 produces a DECREASE DOWN GAIN signal. That indicates that the output frequency of the VCO 26 is rapidly decreasing.

The direction change detector should not activate either output during phase lock with acceptably low error signals because neither the DOWN DETECT nor the UP DETECT signals are often activated. When either signal occurs, then the occurrence of a strong error opposite and immediately afterward indicates that the correction is too fast in an indicated direction, and that the gain for that direction should be decreased. Also, damping can and preferably should be decreased for either direction, and it will be decreased. The NAND ate 808 generates a DECREASE DAMPING signal when either of the NAND gates 804 or 806 is activated and has its output low. Damping gets increased when long trains (at least four) of frequency correction pulses occur in any direction.

FIG. 9 shows an automatic gain control circuit 900 which receives outputs from both the clock detector 700 and the direction change detector 800 and causes the charge and voltage to change on its capacitor 902. It will be recalled that FIG. 6 shows the circuitry of FIG. 9 used twice, once each to generate VUPGAIN and VDOWNGAIN signals. However, the name descriptions in FIG. 9 give only the signal names for the up gain application. Refer to FIG. 6 for the down gain implementation and signal names.

When there is no need to change the gain the input signal INCREASE UP GAIN is low, and the input signal L.DECREASE UP GAIN is high. The inverter 912 produces a high signal to the NAND gate 916. The input signal V from the VCO 26 is then gated through the NAND gate 916, providing a pulsing low to the gate of the transistor 904 each time the clock goes high. The transistor 904 then connects +5 volts to "node 9", charging node 9 up to +5 volts. The transistor 908 is similarly discharging node 15 to ground each period that the clock signal V is high. The term "node 9" (or "node 15") is used to identify an imaginary point that represents the combined capacitance to ground produced by the drain of the transistor 904, the source of the transistor 906, and the connection between them.

The capacitor 902 may be an integrated capacitor formed using the depletion-region capacitance from reversed-biased PN junctions, an MOS transistor, or other technique for moderate capacitance on a digital type chip. Its value is approximately 15 to 100 times the capacitance value of the nodes 9 and 15. When it is necessary to increase the up gain signal, the input signal INCREASE UP GAIN is high, the transistor 904 is held in an off condition and then the transistor 906 couples most of the latent charge from the node 9 to the capacitor 902. Since the capacitor 902 is much larger than the capacitance of the node 9, the voltage on it representing the gain is increased by a small amount. When it is necessary to decrease the gain, the input signal L.DECREASE UP GAIN goes low. That holds the transistor 908 off so that when the VCO clock into the gate of the transistor 920 is high, the transistor 910 is pulsed high on its gate, enabling it to discharge the capacitor 902 slightly as it shares some of its charge with the lower capacitance of the node 15.

When the gain control circuit is used to control the down gain, the signals to it are selected so that the down frequency rate is controlled. Referring back to the frequency control block on FIG. 3A, it will be noted that the VDOWNGAIN signal must be less positive in order to increase the ate to source voltage of the transistor 306. A greater gate to source voltage increases the current from the source to the drain during the positive pulse from the inverter 300 for given pulse widths representing detected phase errors.

The L.INCREASE DOWN GAIN signal is shown coming into the bottom of the down gain block of FIG. 6 since it uses the bottom part of the circuitry of FIG. 9. When the L.INCREASE DOWN GAIN signal goes low, the transistor 908 is held off, and the transistor 910 is pulsed on while the VCO clock is high. The charge on the capacitor 902 is made slightly less positive as it shares its charge with the lower capacitance of node 15. The down gain is decreased when the DECREASE DOWN GAIN signal from the direction change detector 800 is high coming into the top of the gain circuit.

Figure 10:
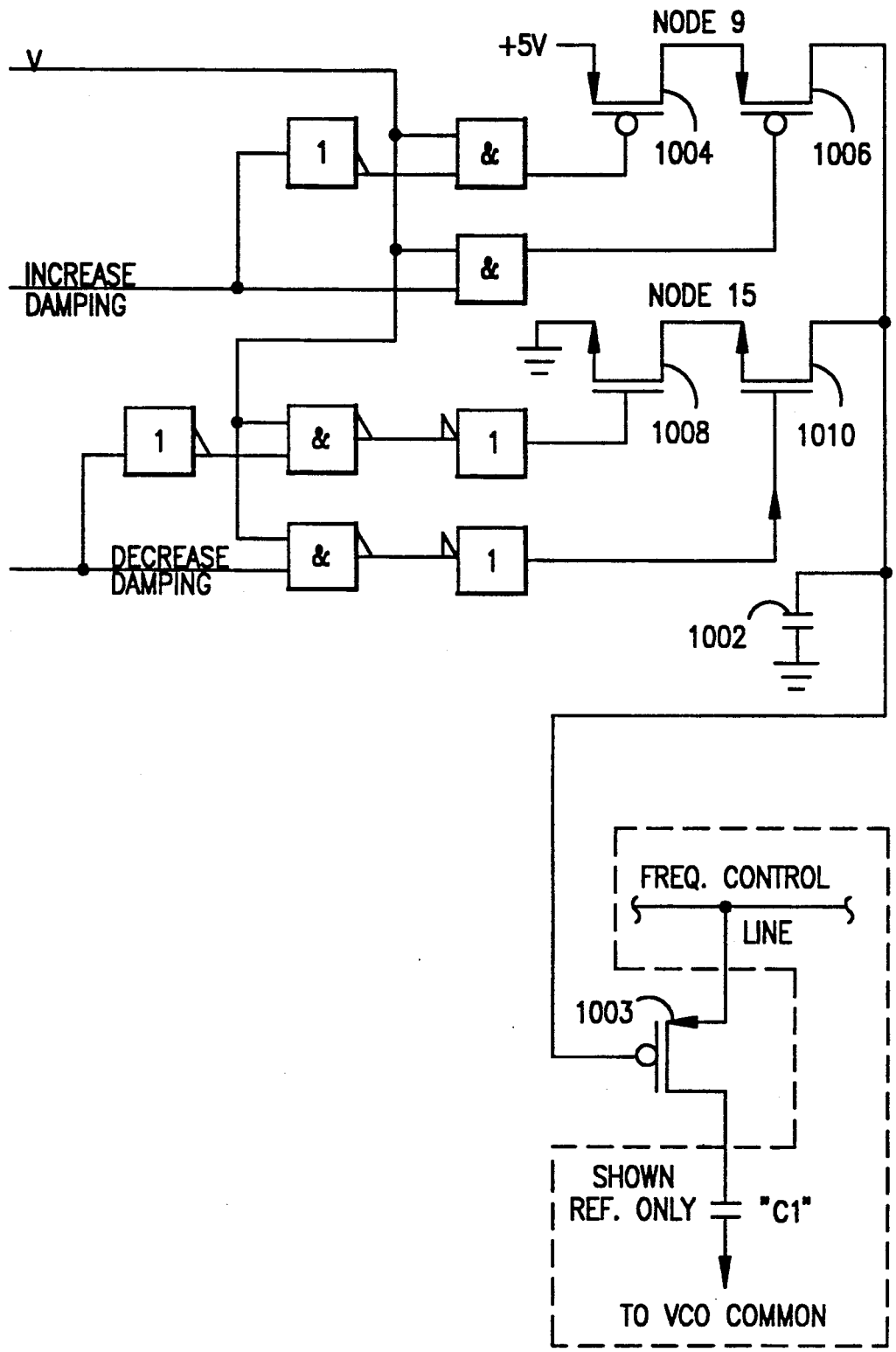
FIG. 10 is a schematic block diagram of the damping control circuit for use with the auto-gain and damping control system shown in FIG. 6.

FIG. 10 shows the damping control circuit. This circuit is very similar to the gain control circuit 900. It also has a node 9 and node 15. When there is no need to change the damping, the clock signal V, as similarly described for the gain control 900, causes node 9 to charge to +5 V and node 15 to charge to ground. When the input signal INCREASE DAMPING from the clock detector is high, the transistor 1004 is held off and then the transistor 1006 couples most of the latent charge from node 9 to the capacitor 1002. The capacitor voltage increases slightly. When the input signal DECREASE DAMPING is high, the momentary connection of node 15 to the capacitor 1002 reduces its voltage slightly.

The voltage from the capacitor 1002 controls the damping resistance ("R2" in PLL literature) introduced by the transistor 1003, a P-channel type with its source connected to the frequency control voltage line from the frequency control 24 to the VCO 26. The drain is connected to the capacitor C1. As the loop becomes locked, the source of the transistor 1003 will come to some voltage between +3 volts and +4 and then remain within a very narrow range while maintaining a nearly constant clock frequency. Since there is no DC current through the capacitor C1, the drain of the transistor 1003 will have the same voltage as its source except during the frequency correction pulses generated by the frequency control circuitry of FIG. 3B. The gate of the transistor 1003 receives the damping control voltage from the capacitor 1002.

When field effect transistors are used as shown, the elements drain and source are nearly interchangeable. If the voltage on the capacitor C1 which is connected to the "drain" happens to be more positive than the element shown as the source, then the element shown as the "drain" can actually operate as a source. When the gate voltage is low enough, whichever element is more positive operates as a source and conducts a charge to the other element which is then operating as a drain. That will occur when a pulse of current from the frequency control circuitry momentarily pulls the element shown as a "source" more negative than the voltage that was on the capacitor C1.

When the circuit is set for low damping, then the frequency correction pulses from the frequency control circuitry are shunted more by the transistor 1003 and tend to work toward storing a charge on the capacitor C1 for later action, slowing the change of the VCO 26 frequency. That condition provides filtering and protection from unwanted frequency changes from noise, but risks instability. When the circuit is set for high damping, then frequency correction pulses are shunted less, changing the capacitor C1 voltage less. With less shunting by the transistor 1003 and the capacitor C1, the line to the VCO 26 can change voltage more during each pulse, allowing a more immediate frequency correction and stability.

Although only a preferred embodiment is specifically illustrated and described herein, it will be appreciated that many modifications and variations of the present invention are possible in light of the above teachings and with the purview of the appended claims without departing from the spirit and intended scope of the invention.

What is claimed is:

1. A digital phase-lock loop system with analog voltage controlled oscillator, comprising:
    a master gate array circuit having a master control loop, which master gate array circuit receives a system reference clock signal from a system to which said master control loop is connected, said master control loop producing a reference clock signal which is synchronized to said received system reference clock signal; and
    a plurality of slave gate array circuits, each having slave control loops, each of said plurality of slave array circuits being connected to receive said reference clock signal from said master control loop by means of an individual delay path connected between each of said plurality of slave gate array circuits and said master gate array circuit such that each of said slave gate array circuits is clocked on the same clock edge of said reference clock signal.

2. The system of claim 1, wherein each of said individual delay paths is of a length such that the propagation delay between said master gate array circuit and each of said slave gate array circuits is approximately equal.

3. The system of claim 1, wherein each of said master and said plurality of slave gate array circuits is implemented as program logic arrays using CMOS type components.

4. The system of claim 1, wherein said master gate array is implemented in ASICs.

5. The system of claim 1, wherein said master control loop is implemented in an ASIC.

6. The system of claim 1, wherein each of said plurality of slave gate array circuits is implemented in ASICs.

7. The system of claim 1, wherein said master control loop comprises:
    a first phase frequency detector circuit connected to receive said system reference clock signal and an internal clock reference signal, said first frequency detector circuit having an output;
    a first frequency controller circuit connected to the output of said first phase frequency detector circuit, said first frequency controller circuit having an output;
    a first voltage controlled oscillator connected to the output of said first frequency controller circuit; and
    an output buffer connected to receive the output from said first voltage controlled oscillator, such that the signal output from said output buffer is said reference clock signal to which said plurality of slave gate array circuits is synchronized.

8. The system of claim 7, further comprising:
    a second phase frequency detector circuit connected to receive as a first input the reference clock signal from said output buffer and as a second input a master internal clock reference signal, said second phase frequency detector circuit having an output;
    a second frequency controller circuit connected to the output of said second phase frequency detector, said second frequency controller circuit having an output;
    a second voltage controlled oscillator circuit connected to the output of said second frequency controller circuit;
    clock driver circuits connected to receive the output from said second voltage controlled oscillator, said clock driver circuit producing a master internal clock reference signal which is provided as a second input to said second phase frequency detector circuit; and a frequency divider circuit which receives said internal clock reference signal, divides said internal clock reference signal by a predetermined whole number and provides its output as a second input signal to said first phase frequency detector circuit.

9. The system of claim 8, wherein said master gate array circuit comprises a plurality of gate arrays which each receive said master internal clock signal produced at the output of said clock driver circuits.

10. The system of claim 1, wherein each of said plurality of slave gate array circuits comprises:

a slave phase frequency detector circuit connected to receive as a first input said reference clock signal from said master control loop and as a second input, a slave internal clock signal;

a slave frequency controller circuit connected to receive the output from said slave phase frequency detector circuit;

a slave voltage controlled oscillator circuit which is connected to receiver the output from said slave frequency controller circuit; and slave clock driver circuits, connected to receive the output from said slave voltage controlled oscillator circuit and to provide a slave internal clock signal to a second input of said slave phase frequency detector circuit.

11. The system of claim 10, wherein each of said slave gate array circuits includes a plurality of slave gate arrays which each receive respective slave internal clock signals.

12. The system of claim 7, wherein any signals input to said first phase frequency detector circuit are fed to said first phase frequency detector circuit after passing through respective static protection circuits.

13. The system of claim 8, wherein said any signals input to said second phase frequency detector circuit are fed to said second phase frequency detector circuit after passing through respective static protection circuits.

14. The system of claim 10, wherein said signals input to said slave phase frequency detector circuit are fed to said slave phase frequency detector circuit after passing through respective static protection circuits.

15. A method of synchronizing the operation of a master gate array circuit and a plurality of slave gate array circuits, comprising the steps of:

receiving a system reference clock signal;

detecting the phase and frequency of said system reference clock signal;

introducing a delay in the propagation time of said reference clock signal to each of said plurality of slave gate array circuits such that said reference clock signal arrives at each of said slave gate array circuits at approximately the same time and;

using the detected phase of said system reference clock signal to produce a reference clock signal which is provided to each of said slave gate array circuits.

16. The method of claim 15, further include the steps of phase and frequency detecting said system reference clock signal and said reference clock signal; and adjusting the phase of said reference clock signal based upon said phase and frequency detecting step.

17. The method of claim 15, wherein said reference clock signal arrives at each of said plurality of slave gate array circuits within 0.5 nanoseconds from each other.

18. The method of claim 16, wherein said adjusting step occurs automatically without operator intervention.

19. The method of claim 15, wherein each of said slave gate array circuits is implemented in ASICs.

20. A digital phase-lock loop system with analog voltage controlled oscillator, comprising:

a master gate array circuit having a master control loop, which master gate array circuit receives a system reference clock signal from a system to which said master control loop is connected, said master control loop producing a reference clock signal which is synchronized to said received system reference clock signal; and a plurality of slave gate array circuits, each having slave control loops, each of said plurality of slave array circuits being connected to receive said reference clock signal from said master control loop by means of a delay path connected between each of said plurality of slave gate array circuits and said master gate array circuit such that each of said slave gate array circuits is clocked on the same clock edge of said reference clock signal.

* * * * *